(12) United States Patent
Terui et al.

(10) Patent No.: US 8,436,524 B2
(45) Date of Patent: May 7, 2013

(54) ELECTRON SOURCE

(75) Inventors: Yoshinori Terui, Tokyo (JP); Ryozo Nonogaki, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 619 days.

(21) Appl. No.: 12/597,961

(22) PCT Filed: May 13, 2008

(86) PCT No.: PCT/JP2008/058766
§ 371 (c)(1),
(2), (4) Date: Oct. 28, 2009

(87) PCT Pub. No.: WO2008/140080
PCT Pub. Date: Nov. 20, 2008

(65) Prior Publication Data
US 2010/0090581 A1 Apr. 15, 2010

(30) Foreign Application Priority Data
May 16, 2007 (JP) .................. 2007-130326

(51) Int. Cl.
*H01J 1/26* (2006.01)
*H01J 1/28* (2006.01)

(52) U.S. Cl.
USPC ................ 313/336; 313/346 R; 313/346 DC

(58) Field of Classification Search .................. 313/336, 313/346 R, 346 DC
See application file for complete search history.

(56) References Cited

U.S. PATENT DOCUMENTS

| 3,681,641 | A | 8/1972 | Katz |
| 4,468,586 | A * | 8/1984 | Hohn ............................ 313/336 |
| 5,030,879 | A | 7/1991 | Derks |
| 5,543,682 | A * | 8/1996 | Hara et al. .................... 313/446 |
| 6,404,115 | B1 | 6/2002 | Sanderson |
| 2006/0028114 | A1 * | 2/2006 | Steenbrink et al. ........... 313/345 |
| 2007/0182303 | A1 | 8/2007 | Steenbrink et al. |
| 2009/0023355 | A1 | 1/2009 | Sakawa et al. |
| 2010/0219357 | A1 | 9/2010 | Steenbrink et al. |
| 2011/0180721 | A1 | 7/2011 | Steenbrink et al. |

FOREIGN PATENT DOCUMENTS

| CN | 1414590 A | 4/2003 |
| EP | 0 391 466 A1 | 10/1990 |
| JP | 50-11576 | 2/1975 |
| JP | 57 196445 | 12/1982 |

(Continued)

OTHER PUBLICATIONS

Tietz, T.E. and Wilson, J.W. "General Behavior of Refractory Metals". Behavior and Properties of Refractory Metals. p. 1 (Jun. 1, 1965).*

(Continued)

*Primary Examiner* — Karabi Guharay
*Assistant Examiner* — Nathaniel Lee
(74) *Attorney, Agent, or Firm* — Oblon, Spivak, McClelland, Maier & Neustadt, L.L.P.

(57) ABSTRACT

Provided is an electron source which provides a stable electron beam even when vibration is applied from external to a device which uses the electron source. The electron source is provided with a needlelike chip (1) having an electron emitting section at one end; a cup-like component (6) bonded to the other end of the needlelike chip (1); and a filament (3) for heating the cup-like component (6). The filament (3) is arranged in a gap inside the cup-like component (6), in a noncontact state to the cup-like component (6).

18 Claims, 2 Drawing Sheets

FOREIGN PATENT DOCUMENTS

| | | |
|---|---|---|
| JP | 58 30035 | 2/1983 |
| JP | 58 189939 | 11/1983 |
| JP | 2 288044 | 11/1990 |
| JP | 5 128963 | 5/1993 |
| JP | 5-128963 | 5/1993 |
| JP | 05128963 A * | 5/1993 |
| JP | 7 6718 | 1/1995 |
| JP | 11-224629 | 8/1999 |
| JP | 11 224629 | 8/1999 |
| JP | 2001 517857 | 10/2001 |
| JP | 2006-134638 | 5/2006 |

OTHER PUBLICATIONS

U.S. Appl. No. 12/667,762, filed Jan. 5, 2010, Nonogaki, et al.
Extended European Search Report issued Aug. 10, 2011, in Patent Application No. 08752646.3.
D. Tuggel, et al. "Application of a thermal field emission source for high resolution, high current e-beam microprobes", J. Vac. Sci. Technol., vol. 16, No. 6, Nov./Dec. 1979, pp. 1699-1703.

* cited by examiner

ELECTRON SOURCE

CROSS REFERENCE TO RELATED APPLICATIONS

The present application is the national stage of international application PCT/JP2008/058766, filed on May 13, 2008, and claims the benefit of the filing date of Japanese Application No. 2007-130326, filed on May 16, 2007.

TECHNICAL FIELD

The present invention relates to an electron source to be applied to scanning electron microscopes, Auger electron spectrometers, electron beam lithography equipment, wafer inspection equipment and the like.

BACKGROUND ART

In recent years, electron sources using cathodes with monocrystalline tungsten needle electrodes having coating layers of zirconium and oxygen (hereinafter referred to as ZrO/W electron sources) have been used to obtain electron beams that are brighter and have a longer operating life than hot cathodes (see Non-Patent Document 1).

ZrO/W electron sources are obtained by providing a reservoir consisting of zirconium and oxygen on a monocrystalline tungsten needle cathode having an axial orientation in the <100> orientation, so that zirconium and oxygen are diffused to form a coating layer (hereinafter referred to as a ZrO coating layer), said ZrO coating layer reducing the work function of the (100) plane of the monocrystalline tungsten single crystal from 4.5 eV to about 2.8 eV, so that only the tiny crystalline facet corresponding to the (100) plane formed at the tip of this cathode forms an electron emission region, as a result of which an electron beam that is brighter than that of conventional thermionic cathodes can be obtained, and the operating life is also prolonged.

As shown in FIG. 1, ZrO/W electron sources comprise a needle tip 1 of tungsten in the <100> orientation for emitting an electron beam affixed by welding or the like at a predetermined position on a tungsten filament 3 provided on conductive terminals 4 affixed to insulator 5. A reservoir 2 for zirconium and oxygen is formed at a portion of the needle tip 1.

In equipment using this kind of electron source, assuming that a low-acceleration electron beam is used, the diameter of the electron beam when focused by a lens will be determined by chromatic aberration, and in order to reduce the chromatic aberration, the energy width of the electrons emitted from the electron source must be made smaller.

While lowering the operating temperature of the electron source is effective in reducing chromatic aberration, lowering the operating temperature also dramatically reduces the emission current, so that an electron source with a low work function must be used in order to enable the operational temperature of the electron source to be lowered. In view of the above circumstances, recent years have seen much activity in the search for species adsorbing to monocrystalline tungsten having a low work function, and reservoirs thereof, as an alternative to ZrO adsorption layers.

On the other hand, cold field emission electron sources have needle cathodes of monocrystalline tungsten in the <111>, <310> or <100> orientation welded to a tungsten filament, and have very small emission currents compared with ZrO/W electron sources, but they operate at room temperature and thus have low chromatic aberration and are used as electron sources for high-resolution SEM (see, e.g., Patent Document 1).

Since cold field emission electron sources are operated at room temperature, gas tends to adsorb to the electron emission surface, making the beam current gradually unstable. Therefore, they must be operated in a high degree of vacuum, and must be periodically subjected to a cleaning by heating the filament, called flashing.

More recently, nano-electron sources bearing tiny atomic scale tips have been prepared at the experimental stage, and their application as extremely small point sources for ultra-high-resolution SEM is being considered. Since the production of nano-electron sources also normally requires a heating step during the production process, they normally have a structure in which a needle tip similar to that of FIG. 1 is welded to a heating filament (see Patent Document 2).

Patent Document 1: JP S50-11576A
Patent Document 2: JP 2006-134638A
Non-Patent Document 1: D. Tuggle, *J. Vac. Sci. Technol.*, 16, p. 1699 (1979).

DISCLOSURE OF THE INVENTION

Problems to be Solved by the Invention

However, returning to the subject of ZrO/W electron sources, when a SEM image is observed at a relatively high magnification using a ZrO/W electron source, vibrations from around the apparatus can generate noise, thus breaking up the resolution and preventing measurements from being made.

The present invention was made in consideration of the above circumstances, and has the object of offering an electron source providing a stable electron beam even if the apparatus using the electron source is subjected to vibrations from external sources.

Means for Solving the Problems

The present invention offers an electron source comprising a rod having an electron emitting portion at one end, a heat-transmitting portion connected to another end of the rod different from the one end, and an electrothermal conversion portion for heating the heat-transmitting portion, wherein the electrothermal conversion portion is disposed inside a cavity provided in the heat-transmitting portion, in a state of non-contact with the heat-transmitting portion.

Due to this structure, the electrothermal conversion portion is disposed inside a cavity provided in the heat-transmitting portion, in a state of non-contact with the heat-transmitting portion, so the electron emitting portion of the rod which is connected to the heat-transmitting portion and the electrothermal conversion portion are in a state of mutual non-contact. Additionally, since the electrothermal conversion portion and the electron emitting portion are provided in a state of mutual non-contact, even if the electrothermal conversion portion resonates with vibrations generated outside the device, it is possible to almost completely prevent resonant vibrations of the electrothermal conversion portion from being transmitted along the electron emitting portion to cause vibrations of the electron emitting portion itself.

As a result of this structure, the electron emitting portion is almost free of vibrations, thus suppressing the generation of even extremely minor noise in the electron beams emitted from the electron source. That is, according to this structure, even if a device using an electron source is subject to vibrations from external sources, it is capable of providing stable electron beams.

Effects of the Invention

According to the present invention, the electrothermal conversion portion is disposed inside a cavity provided in the heat-transmitting portion in a state of non-contact with the heat-transmitting portion, so even if a device using the electron source is subject to vibrations from external sources, it is capable of providing stable electron beams.

IG. 3 A view of the electron source of the present invention (FIG. 2) as seen from the direction of the needle tip.

Figure 4:
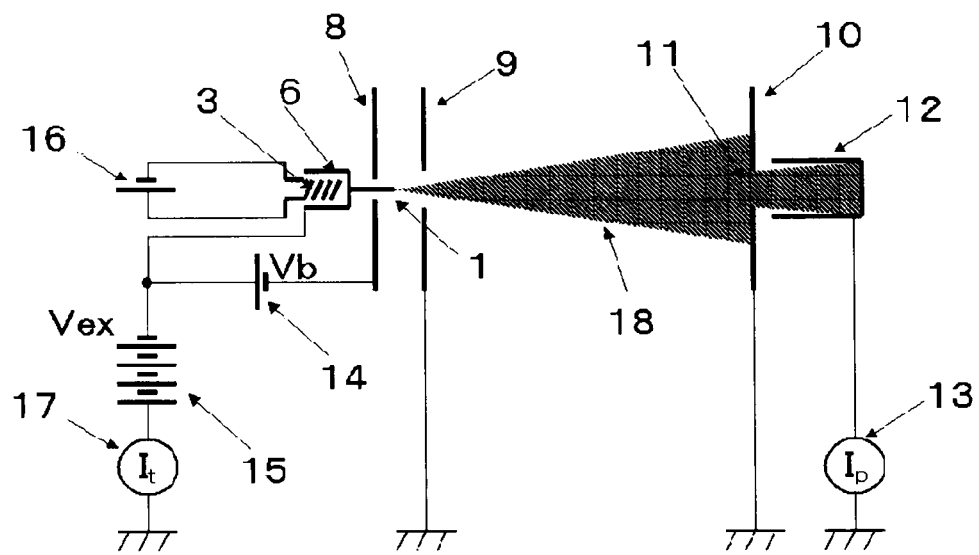

FIG. 4 A structural diagram of an apparatus for evaluating an electron emission characteristic.

| Description of the Reference Numbers | |
|---|---|
| 1 | needle tip |
| 2 | reservoir |
| 3 | filament |
| 4 | conductive terminal |
| 5 | insulator |
| 6 | cup-shaped part |
| 7 | metallic part |
| 8 | suppressor electrode |
| 9 | extractor electrode |
| 10 | phosphor screen |
| 11 | aperture |
| 12 | cup-shaped electrode |
| 13 | micro-current meter for measuring probe current |
| 14 | bias power source |
| 15 | high-voltage power source |
| 16 | filament heating power source |
| 17 | current meter for measuring total emission current |
| 18 | emitted electron beam |
| 20 | metallic piece |

BEST MODES FOR CARRYING OUT THE INVENTION

<Explanation of Terminology>

The meanings of terminology used in the present specification and claims are defined as below.

Lower numerical limit—upper numerical limit: Refers to the range from the lower numerical limit or more and the upper numerical limit or less.

Rod: Refers to an article shaped like a stick or baton. Rods shall be considered to include those that are in the form of cylinders, square columns, triangular columns, cones, square pyramids, triangular pyramids, linear or needle-shaped. Additionally, rods shall be considered to include the needle tips to be described below.

Cup-shaped structure: Refers to a structure shaped like a container such as a type of tableware such as goblets, cups, coffee mugs, teacups, mugs and cup-type noodles. Any three-dimensional structure having a recess with at least one opening shall be considered to be a cup-shaped structure.

<History of the Invention>

The present inventors recognized that when a SEM image is observed at a relatively high magnification using a ZrO/W electron source, the noise generated by vibrations around the device can reduce the resolution and prevent measurements from being made, so they performed diligent research and development into eliminating this noise. As a result, the present inventors found that this noise is caused by vibrations of the tungsten filament of the ZrO/W electron source at a resonance frequency.

Furthermore, the present inventors found that the above-mentioned conventional art has a structure wherein the cathode is welded to a heating filament, so that when a SEM image is observed at a relatively high magnification, the heating filament will have a specific resonance frequency, and the heating filament will resonate with vibrations generated outside the device. Thus, the present inventors guessed that the resonance could be suppressed by separating the heating filament itself from the cathode in some way.

On the other hand, while the present inventors tried suppressing the vibration of the tip by providing an anti-vibration structure outside the device, in order to completely prevent resonance using such a solution, the device must be made rather complex.

Therefore, the present inventors thought of removing the heating element itself from the cathode and heating the cathode by a completely different method, and thus preparing an electron source comprising a rod having an electron emitting portion at one end, a heat-transmitting portion connected to another end of said rod different from said one end, and an electrothermal conversion portion for heating said heat-transmitting portion, wherein said electrothermal conversion portion is disposed inside a cavity provided in said heat-transmitting portion, in a state of non-contact with said heat-transmitting portion, whereupon they confirmed that such an electron source was capable of inhibiting noise, thus completing the present invention.

<Embodiments>

Herebelow, embodiments of the present invention will be explained using as an example an electron emitting cathode having an operating temperature of 1500 K or less used for electron microscopes, electron beam lithography, critical dimension SEM or the like, but the present invention is not limited thereto. In all of the drawings, identical structural elements will be referred to by identical reference numbers, and their explanations will be omitted.

Figure 2:
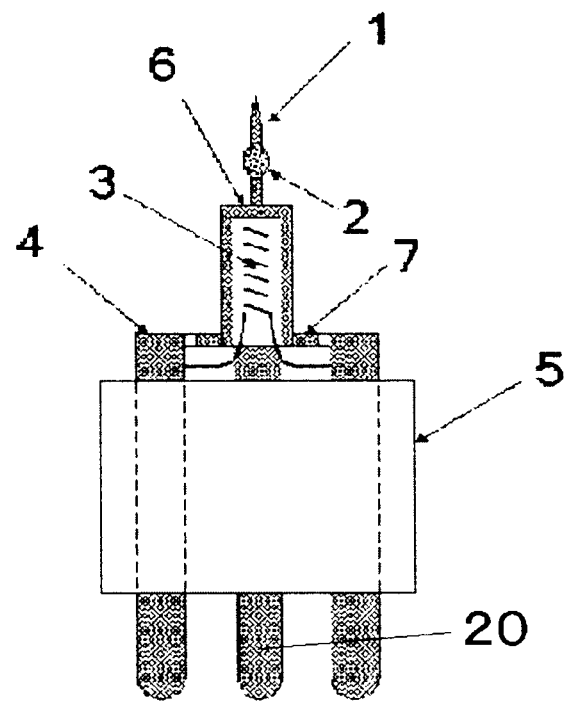
FIG. 2 A structural diagram of an example of an electron source according to the present invention.
Figure 3:
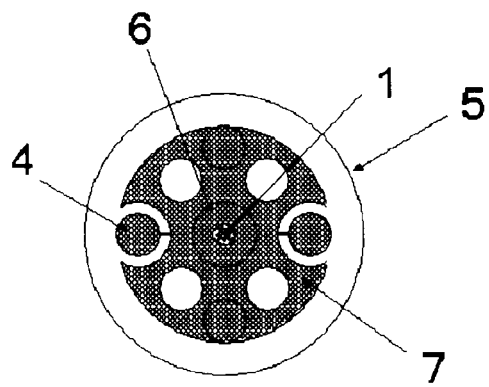

FIG. 2 is a drawing showing an example of an electron source according to the present embodiment as seen from a horizontal direction, and FIG. 3 is a drawing showing an example of an electron source according to the present embodiment as seen from the needle tip. As shown in FIGS. 2 and 3, the electron source of the present embodiment comprises a needle tip 1 (rod) having an electron emitting portion at one end, a cup-shaped part 6 (heat transmitting portion) connected to another end of the needle tip (rod) different from the one end, and a filament 3 (electrothermal conversion portion) for heating the cup-shaped part 6 (heat transmitting portion).

Additionally, in the electron source according to the present embodiment, the filament 3 (electrothermal conversion portion) is disposed inside a cavity provided in the cup-shaped part 6 (heat transmitting portion) in a state of non-contact with the cup-shaped part 6 (heat transmitting portion). Additionally, the electron source of the present embodiment further comprises a pair of conductive terminals 4 electrically connected to both ends of the filament 3 (electrothermal conversion portion) and an insulator 5 directly or indirectly holding the pair of conductive terminals 4 and the cup-shaped part 6 (heat transmitting portion).

Additionally, the electron source according to the present embodiment is affixed to the insulator 5, through the medium of a metal part 7 if necessary, in such a way that the cup portion of the cup-shaped part 6 abuts the insulator 5. Additionally, the other end of the needle tip 1 (rod) from the electron emitting portion is connected to the outside bottom portion of the cup-shaped part 6 (cup-shaped structure). That is, the needle tip 1 (rod) comprises an electron emitting portion at a tip portion which is at one end, and is connected to the outside bottom portion of the cup-shaped portion 6 (cup-shaped structure) at a base portion which is the other end, and a vector from the base portion of the needle tip 1 (rod) to the tip portion is roughly perpendicular to the plane of the outside bottom portion of the cup-shaped part 6 (cup-shaped structure).

To be more specific, a needle tip 1 consisting of a high melting point monocrystalline metal that radiates an electron beam is affixed by welding or the like to a predetermined position on the outside bottom portion of the cup-shaped part 6. Additionally, a heating filament 3 functioning as a heater is disposed inside the cup of the cup-shape part 6 in a state of mechanical and electrical non-contact, and this heating filament 3 is electrically connected to the conductive terminal 4 affixed to the insulator 5.

Here, the material for the heating filament 3 functioning as a heater inside the cup of the cup-shaped part 6 is not particularly restricted, but for example, from the standpoint of heating efficiency, it is preferable to use a heating filament 3 made of tungsten. Additionally, when disposing heating filament 3, the configuration of the disposing is not particularly restricted, as long as the heating filament 3 is not in contact with the cup-shaped part 6, and it is possible to heat the cup-shaped part 6 and the needle tip 1 to the stable operating temperature range of the electron source with radiation heat from the heating filament 3. As a concrete example, as shown in FIG. 2, the heating filament 3 may be disposed so as to be wound in the form of a spiral inside the cup of the cup-shaped part 6, with a predetermined space (e.g., a space of 0.2 mm or greater) between it and the cup-shaped part 6.

By disposing it so as to be wound in the form of a spiral in this way, the structure of the heating filament 3 will become mechanically stable, so that the heating filament 3 will not come into contact with the cup-shaped part 6 even if there is some vibration, and a large surface area of the heating filament 3 can be secured inside the cup, so that the cup-shaped part 6 and the needle tip 1 can be efficiently heated to the stable operating temperature range of the electron source with radiation heat from the heating filament 3. Further, the portion of this heating filament 3 that is in the form of a spiral can be affixed by welding, through the portion of the heating filament 3 that is not in the form of a spiral, to the conductive terminals 4 that have been brazed to the insulator 5, making heating by the conduction of current possible.

The electron source according to the present embodiment utilizes said structure, so that it is possible to heat the cup-shaped part 6 and the needle tip 1 to the stable operating temperature range of the electron source with radiation heat from the heating filament 3, and at the same time, since vibrations of the heating filament 3 are not transmitted to the cup-shaped part 6, the generation of noise due to resonant vibration of the cathode (negative electrode, that is, the needle tip 1) due to vibrations from external sources can be kept extremely small. That is, according to the electron source according to the present embodiment, since the heating filament 3 (electrothermal conversion portion) is disposed so as to be in a non-contacting state with respect to the cup-shaped part 6 (heat transmitting portion), in the space provided in the inside of the cup-shaped part 6 (heat transmitting portion), a stable electron beam can be achieved even if the device using the electron source is subject to vibrations from external sources. As a result, in devices using said electron source, a high resolution can be obtained without having to provide an anti-vibration structure to its exterior, so the exceptional effect of being able to achieve high reliability at low cost can be obtained.

Here, the material to be used for the needle tip 1 in the present embodiment is not particularly restricted, and an arbitrary publicly known material may be used, but it is preferable for this to be a monocrystal of a metal with a high melting point, and it is particularly preferable for it to be a monocrystal of an element selected from either tungsten (W), molybdenum (Mo), iridium (Ir), niobium (Nb), tantalum (Ta), or rhenium (Re), since reliability will not be lost due to depletion by evaporation or the like.

Further, as the material for the needle tip 1, for example, using monocrystalline tungsten (W) or monocrystalline molybdenum (Mo) is still more preferable. More concretely, it is most preferable to use a needle tip (rod, cathode) that is monocrystalline tungsten having an axial orientation in the <100> orientation. This is because if such a material is used as the material of the needle tip 1, an electron source that can emit an electron beam that has a long operating life, and is brighter, can be obtained.

Additionally, although this is not intended to be a restriction, it is preferable for the needle tip 1 to be provided with a reservoir comprising metal and oxygen having the effect of decreasing the work function of the electron emitting surface. As a concrete example, an electron source having a reservoir comprising a metal oxide containing an element selected from the group comprising zirconium (Zr), titanium (Ti), hafnium (Hf), scandium (Sc), yttrium (Y), lanthanoid series elements, barium (Ba), strontium (Sr), and calcium (Ca), is particularly preferable as a field-emission electron source for use as an electron source for high resolution SEMs.

Additionally, regarding the cup-shaped part 6 used in the present embodiment, this is not particularly restricted, and an arbitrary publicly known material may be used, but for similar reasons, it is preferable for this to be a monocrystal of a metal with a high melting point, and it is particularly preferable for it to be a monocrystal of an element selected from either tungsten (W), molybdenum (Mo), iridium (Ir), niobium (Nb), tantalum (Ta), or rhenium (Re), since reliability will not be lost due to depletion by evaporation or the like.

Regarding the affixing of the cup-shaped part 6 to the insulator 5, it may be affixed directly to the insulator 5 by a method such as brazing, but as shown in FIG. 2, by first affixing a metallic part 7 to which the cup-shaped part 6 can be affixed by welding or the like to the insulator 5 by brazing or the like, and later affixing the cup-shaped part 6, manufacture becomes easier, and the cup can be affixed strongly, so this is preferable. Further, in order to reduce the escaping of heat while maintaining rigidity, it is preferable for the metallic part 7 to be provided with several holes as shown in FIG. 3. Additionally, it is preferable for the metallic part 7 for affixing the cup-shaped part 6 to be installed so as not to come into electrical contact with the pair of conductive terminals 4 brazed to the insulator 5, with a space in between, so as to allow for electrical control. Additionally, in order to realize mechanical structural stability, it is further preferable for the metallic part 7 for affixing the cup-shaped part 6 to be connected to the insulator 5 through a separate metallic piece 20.

Additionally, in cases where both the needle tip 1 or the cup-shaped part 6 is an integrally molded part comprising a single monocrystal of an element selected from among tungsten, molybdenum, iridium, niobium, tantalum, or rhenium, by merely affixing the cup-shaped part 6 to the insulator 5 by welding or the like, there is no need for later connecting the needle tip 1, so the advantage of easier manufacture can be obtained. Further, in this case, the needle tip 1 can be formed in advance on the cup-shaped part 6 with good positional accuracy, and an electron source having excellent positional accuracy of the needle tip can be readily obtained, so it is preferable.

There is no reason to provide an upper limit on the usable temperature of the electron source of the present embodiment, but when utilizing a normal heating filament 3 comprising tungsten, tungsten-rhenium, or the like for the heater, the tolerable temperature for the heating filament 3 is 2000 K or below, and the temperature of the needle tip 1 for which stable operation can be secured is 1500 K or below, and is preferably 1300 K or below. Accordingly, the effects of the present embodiment can be significantly realized with an electron source having an operating temperature of 1500 K or below, and more preferably, an electron source having an operating temperature of 1300 K or below.

As the electron source that stably operates at a temperature of 1500 K or below, an electron source wherein the needle tip 1 comprises a tungsten monocrystal or a molybdenum monocrystal, and having a reservoir comprising oxygen and a metal having the effect of decreasing the work function of the electron emitting surface, especially a reservoir comprising a metal oxide containing an element selected from the group including titanium, hafnium, scandium, yttrium, lanthanoid series elements, barium, strontium, and calcium, can preferably be used.

FIG. 4 is a configuration diagram of an evaluation device for the electron emission characteristic. As FIG. 4 shows, this needle tip 1 is disposed between the extractor electrode 9 and the suppressor electrode 8, and a high negative voltage of several kilovolts relative to the extractor electrode 9 is applied to the needle tip 1. Electron emission can be carried out by applying a negative voltage of several hundred volts with respect to the needle tip 1 to the suppressor electrode 8, and concurrently heating the needle tip 1 to 1300 K or below.

<Actions and Effects>

Herebelow, the actions and effects of the electron source of the present embodiment shall be explained.

The electron source according to the present embodiment is an the electron source which comprises a needle tip 1 having an electron emitting portion at one end, a cup-shaped part 6 connected to another end of the needle tip 1 different from the one end, and a filament 3 for heating the cup-shaped part 6. Further, the filament 3 is disposed inside a cavity provided in the cup-shaped part 6 in a state of non-contact with the cup-shaped part 6.

Due to this structure, since the heating filament 3 is disposed inside a cavity provided in the cup-shaped part 6 in a state of non-contact with the cup-shaped part 6, both the heating filament 3 and the electron emitting portion of the needle tip connected to the cup-shaped part 6 are provided in a state of mutual non-contact. Further, since the heating filament 3 and the electron emitting portion are provided in a state of mutual non-contact, even if the heating filament 3 resonates in response to a vibration generated externally to the device, the vibrating of the electron emitting portion itself due to the transmission of the resonant vibration of the heating filament 3 to the electron emitting portion can be almost completely suppressed.

As a result, due to this structure, the electron emitting portion almost completely does not vibrate, so that even the generation of extremely minor noise in the electron beam emitted from the electron source can be suppressed. That is, due to this structure, even if a device using the electron source is subject to vibrations from external sources, a stable electron beam can be provided.

That is, due to this structure, when the electron source undergoes actual use, the generation of noise due to the electron source resonating with vibrations from the vicinity of the device can be prevented, so even in cases where, for example, SEM images are observed at a high magnification, the effect of being able to provide electron beams having a high resolution can be obtained. Particularly, in optical systems which focus an electron beam with no magnification, magnification, or weak demagnification, the extremely minor noise due to this tiny vibration of the needle tip 1 can easily become serious, so a serious influence such as this can be prevented.

Additionally, the electron source according to the present embodiment further comprises a pair of conductive terminals 4 electrically connected to both ends of the filament 3 and an insulator 5 directly or indirectly holding the pair of conductive terminals 4 and the heating filament 3.

Whereby, with the electron source according to the present embodiment, an electric current can be applied to the heating filament 3 through the pair of conductive terminals 4, and it becomes possible to heat the cup-shaped part 6 and the needle tip 1 to the stable operating temperature range of the electron source with radiation heat from the heating filament 3. Additionally, since the heating filament 3 can be held through the pair of conductive terminals by the insulator 5, the mechanical structural stability of the electron source according to the present embodiment can be heightened.

Additionally, in the electron source according to the present embodiment, the cup-shaped part 6 has a recess having an opening, and the other end of the needle tip 1 is connected to the outside bottom portion of the cup-shaped part 6. Further, the heating filament 3 is disposed inside the cup-shaped part 6 so as to be in a state of non-contact with the cup-shaped part 6.

Whereby, since in the electron source according to the present embodiment, the cup-shaped part 6 has a recess having an opening, it is possible to dispose the heating filament 3 inside the cup-shaped part 6 so as to be in a state of non-contact with the cup-shaped part. As a result, it becomes possible to heat the cup-shaped part 6 and the needle tip 1 efficiently to the stable operating temperature range of the electron source with radiation heat from the heating filament 3. Additionally, since the other end of the needle tip 1 is connected to the outside bottom portion of the cup-shaped part 6, it becomes easy to assemble the electron source and the mechanical structural stability and the positional accuracy of the needle tip 1 can be heightened.

Additionally, in the electron source according to the present embodiment, the needle tip 1 comprises an electron emitting portion at a tip portion which is at one end, and is connected to the outside bottom portion of the cup-shaped portion 6 at a base portion which is the other end, and a vector from the base portion of the needle tip 1 to the tip portion is roughly perpendicular to the plane of the outside bottom portion of the cup-shaped part 6.

Whereby, when assembling the electron source, positioning at the outside bottom portion of the cup-shaped part 6 of the needle tip 1, and affixing by welding and the like becomes easy, and the mechanical structural stability and the positional accuracy can be further heightened.

Additionally, with the electron source according to the present embodiment, it is preferable for the needle tip 1 to have a tungsten, molybdenum, iridium, niobium, tantalum, or rhenium monocrystal, and a reservoir for diffusing an oxide of a metal element provided on the monocrystal. Additionally, it is preferable for this metal oxide to contain one or more elements selected from the group comprising zirconium, titanium, hafnium, scandium, yttrium, lanthanoid series elements, barium, strontium, and calcium.

By doing so, the feature can be achieved whereby the work function of the electron emitting surface of the needle tip 1 can be kept low even during long-term operation under operating conditions such as 1300 K.

Additionally, in the electron source according to the present embodiment, it is preferable for the cup-shaped part 6 to comprise a material containing one or more metals selected from the group comprising tungsten, molybdenum, iridium, niobium, tantalum, and rhenium. Additionally, it is more preferable for the cup-shaped part 6 and the needle tip 1 to have an integrally molded structure comprising a tungsten, molybdenum, iridium, niobium, tantalum, or rhenium monocrystal.

By doing so, since the cup-shaped part 6 and the needle tip 1 is an integrally molded structure comprising the same material, by merely affixing the cup-shaped part 6 to the insulator 5 by welding or the like, there is no need for later connecting the needle tip 1, so the advantage of easier manufacture can be obtained. Further, in this case, the needle tip 1 can be formed in advance on the cup-shaped part 6 with good positional accuracy, and an electron source having excellent positional accuracy of the needle tip can be readily obtained, so it is preferable.

Additionally, for the electron source according to the present embodiment, it is preferable for the operating temperature of the needle tip 1 to be 1500 K or below. This is because the heating of the needle tip 1 due to the heating filament 3 can be secured for 1500 K or below, and when within this temperature range, even if the device using the electron source is subject to an external vibration, the vibration of the electron emitting portion can be particularly effectively suppressed, so that a yet more stable electron beam can be provided.

Embodiments of the present invention have been explained above with reference to drawings, but these are merely examples of the present invention, and various constitutions other than those described above may be utilized.

For example, in an above-described embodiment, the heating filament 3 was disposed so as to be wound in the form of a spiral inside the cup of the cup-shaped part 6, but this is not particularly intended to be a restriction. For example, the heating filament 3 may be bent in a zigzag inside the cup of the cup-shaped part 6, with a predetermined space (e.g., a space of 0.2 mm or greater) between it and the cup-shaped part 6. The structure of the heating filament 3 will similarly be mechanically stable as well in this case, so that even if there is some vibration, the heating filament 3 will not come into contact with the cup-shaped part 6, and a large surface area of the heating filament 3 can be secured within the cup, so that the advantage can be obtained of being able to heat the cup-shaped part 6 and the needle tip 1 efficiently to the stable operating temperature range of the electron source with radiation heat from the heating filament 3.

EXAMPLES

Herebelow, the present invention shall be further explained through embodiment examples, but the present invention is not restricted to these.

Embodiment Examples

As shown in FIG. 2 and FIG. 3, a tungsten filament 3 was affixed to a pair of conductive terminals 4 by spot welding, so as to be inserted inside the cup-shaped part 6 comprising tungsten affixed to an insulator 5, without making contact. A monocrystalline tungsten needle tip 1 having a <100> orientation was attached to the outside bottom portion of the cup-shaped part 6 by spot welding.

Next, the tip portion of the needle tip 1 was sharpened by electrolytic polishing. Next, as a material constituting the reservoir, barium aluminate ($BaAl_2O_4$) powder was ground, mixed with isoamyl acetate, and was coated on one portion of the needle tip 1 in a paste form. The reservoir was burnt at 1500 K by heating with the filament 3 in an ultrahigh vacuum of approximately $4\times10^{-8}$ Pa, and the electron source having the structure shown in FIG. 2 was obtained.

The aforementioned electron source was put into the sample chamber of an SEM, and installed so that the axial direction of the cathode comprising the needle tip 1 would be the scanning direction, and position adjustment was done so that the side surface in the vicinity of the tip of the cathode can be obtained as an SEM image on the monitor. As a sound source, software that can sweep frequencies over an arbitrary range, mode, and speed (Test Tone Generator) was used, and speakers were connected to a PC. At a given volume, the speaker was affixed at a given position and direction outside and in the vicinity of the sample chamber wherein the aforementioned cathode was.

The magnification of the SEM was set to 50,000 times, and the image manipulation time on the monitor was set to 80 seconds. Additionally, the sound generation conditions were set so that the frequency range was 1000 to 4000 Hz, and that range was swept linearly in 80 seconds. Due to vibrations due to resonance, the image shifted in the horizontal direction during scanning at the corresponding frequency, and twice the width of this shift was defined to be the amplitude under this condition.

In order to carry out electron emission characteristic evaluation, the aforementioned electron source was introduced into the evaluation device having the electrode constitution shown in FIG. 4. The tip portion of the needle tip 1 is disposed between the suppressor electrode 8 and the extractor electrode 9. The needle tip 1 is connected to the filament heating power source 16, and further connected to the high voltage power source 15, and a high negative voltage with respect to the extractor electrode 9 is applied. Additionally, the suppressor electrode 8 is connected to the bias power source 14, and a further negative voltage relative to the needle tip 1 is applied. Whereby, the thermal electrons from the cup-shaped part 6 are blocked. All the emitted current from the electron source is measured by a current meter 17 placed between the high voltage source 15 and earth. One portion of the electron beams 18 emitted from the tip portion of the needle tip 1 passes through the aperture 11 in the center of the phosphor screen 10, and the probe current Ip that reaches the cup-shaped electrode 12 is measured with a micro-current meter 13. With $\omega$ defined as the solid angle calculated from the distance from the aperture 11 to the tip portion of the needle tip 1 and the inside diameter of the aperture 11, the angular current density is Ip/$\omega$.

Next, after vacuuming the electron emission characteristic evaluation device, the filament 3 was heated by applying current and it was observed that the needle tip 1 was heated to 1100 K. Further, a 50 V voltage was applied to the suppressor electrode 8, and a high voltage of 3 kV was applied to the extractor electrode 9, and a stable electron emission with an angular current density of 4 mA/sr and total emitted current of 120 μA was observed.

Comparative Example

Figure 1:
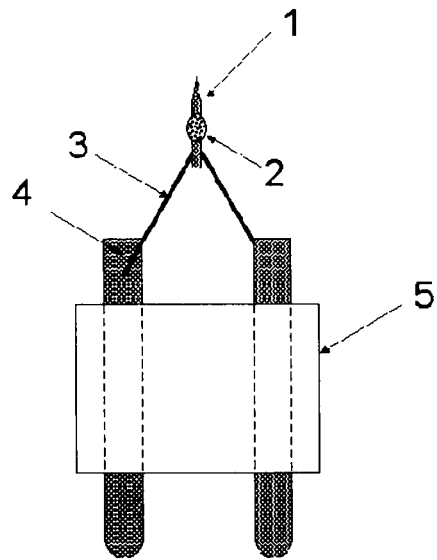
FIG. 1 A structural diagram of a conventional, publicly known electron source according to a comparative example.

In the structure shown in FIG. 1, having a conventional structure, that is, a structure where a tungsten needle tip 1 having an orientation of <100> is affixed by spot welding onto a tungsten filament 3 provided on a conductive terminal 4 affixed to an insulator 5, a barium aluminate reservoir was formed using the same method as in the example. A resonance test and a cathode tip position stability evaluation test were similarly carried out.

Test Results

The resonance test results when the Embodiment Example and the Comparative Example were tested with n=3 for each are shown in Table 1. In the resonance test, the resonance frequency was almost the same, but it was confirmed that the amplitude was significantly suppressed for the Example.

TABLE 1

|  | n | Resonance Frequency [Hz] | Amplitude [μm] |
|---|---|---|---|
| Example | 1 | Indeterminable because | <0.1 |
|  | 2 | amplitude is below lower | <0.1 |
|  | 3 | limit of detection of 0.1 μm | <0.1 |
| Comparative | 1 | 2741 | 2.6 |
| Example | 2 | 2663 | 2.5 |
|  | 3 | 2709 | 3.2 |

The present invention has been explained above based on an example. This example is merely one exemplification, and it will be understood by those skilled in the art that various modified examples are possible, and such modified examples are within the scope of the present invention.

For example, in the above example, monocrystalline tungsten (W) was used as the material of the cup-shaped part 6, but monocrystals of any of tungsten (W), molybdenum (Mo), iridium (Ir), niobium (Nb), tantalum (Ta), or rhenium (Re) may be used. A material comprising any monocrystal, as long as it is a monocrystal of a metal having a high melting point is preferable, since reliability will not be lost due to depletion by evaporation or the like.

INDUSTRIAL APPLICABILITY

The electron source of the present invention has a specific structure, which is not readily subject to the influence of vibrations from external sources, so it has the feature of being able to provide a stable electron beam, and by applying it to various electron beam-utilizing devices such as scanning electron microscopes, Auger electron spectroscopy, electron beam lithography equipment, and wafer inspection equipment, the performance of a high brightness electron beam can sufficiently be realized, and a high resolution can be achieved. In particular, it is extremely advantageous in optical systems in which electron beam is focused with no magnification, with magnification, or with low demagnification, and is therefore extremely industrially useful.

The invention claimed is:

1. An electron source, comprising:
a monocrystalline metal needle rod comprising a reservoir of metal oxide coating a surface of the monocrystalline metal, having an electron emitting portion at a first end of the rod;
a cup-shaped heat-transmitting portion connected to a second end of the rod different from the first end; and
an electrothermal conversion portion, which heats the heat-transmitting portion,
wherein the electrothermal conversion portion is comprised inside a cavity provided in the heat-transmitting portion, in a state of non-contact with the heat-transmitting portion,
the heat-transmitting portion and the rod have an integrally molded structure comprising a monocrystal of tungsten, molybdenum, iridium, niobium, tantalum, or rhenium, and
a reservoir for diffusing an oxide of metallic elements is provided in the monocrystal of the rod.

2. The electron source of claim 1, further comprising:
a pair of conductor terminals electrically connected to a first and a second terminus of a filament; and
an insulator for directly or indirectly holding the pair of conductive terminals and the heat-transmitting portion,
wherein the electrothermal conversion portion is the filament, which heats the heat transmitting portion.

3. The electron source of claim 1, wherein the second end of the rod is connected to an outer bottom portion of the cup-shaped heat-transmitting portion.

4. The electron source of claim 3, wherein the electrothermal conversion portion is a heating filament comprised inside the cup-shaped heat-transmitting portion, in a non-contact state with respect to the cup-shaped heat-transmitting portion.

5. The electron source of claim 3, wherein the rod is a needle tip having the electron emitting portion at a tip portion which is the first end, and connected to the outer bottom portion of the cup-shaped heat-transmitting portion at a base portion which is the second end, and
wherein a vector from the base portion to the tip portion of the needle tip is roughly perpendicular to the plane of the outer bottom portion of the cup-shaped heat-transmitting portion.

6. The electron source of claim 1, wherein the oxide comprises zirconium, titanium, hafnium, scandium, yttrium, a lanthanoid series element, barium, strontium, calcium, or a mixture thereof.

7. The electron source of claim 1, wherein the heat-transmitting portion comprises tungsten, molybdenum, iridium, niobium, tantalum, rhenium, or a mixture thereof.

8. The electron source of claim 1, wherein an operating temperature of the rod is 1500 K or less.

9. The electron source of claim 1, wherein the monocrystal comprises tungsten.

10. The electron source of claim 9, wherein the monocrystal has a <100>axial orientation.

11. The electron source of claim 1, wherein the monocrystal comprises molybdenum.

12. The electron source of claim 1, wherein the monocrystal comprises iridium.

13. The electron source of claim 1, wherein the monocrystal comprises niobium.

14. The electron source of claim 1, wherein the monocrystal comprises tantalum.

15. The electron source of claim 1, wherein the monocrystal comprises rhenium.

16. The electron source of claim 9, wherein the oxide comprises zirconium.

17. The electron source of claim 1, wherein the heat-transmitting portion consists essentially of tungsten, molybdenum, iridium, niobium, tantalum, rhenium, or a mixture thereof.

18. The electron source of claim 1, wherein the heat-transmitting portion and the rod have an integrally molded structure consisting essentially of a monocrystal of tungsten, molybdenum, iridium, niobium, tantalum, or rhenium.

* * * * *